United States Patent
Wiley

(10) Patent No.: US 9,173,327 B2
(45) Date of Patent: Oct. 27, 2015

(54) COOLING SERVERS IN A DATA CENTER USING PREVAILING WINDS

(71) Applicant: Facebook, Inc., Menlo Park, CA (US)

(72) Inventor: Scott Wiley, Los Altos, CA (US)

(73) Assignee: Facebook, Inc., Menlo Park, CA (US)

( * ) Notice: Subject to any disclaimer, the term of this patent is extended or adjusted under 35 U.S.C. 154(b) by 278 days.

(21) Appl. No.: 13/725,283

(22) Filed: Dec. 21, 2012

(65) Prior Publication Data

US 2014/0177163 A1    Jun. 26, 2014

(51) Int. Cl.
*H05K 7/20* (2006.01)
*G06F 1/20* (2006.01)

(52) U.S. Cl.
CPC .............. *H05K 7/20745* (2013.01); *G06F 1/20* (2013.01)

(58) Field of Classification Search
CPC ........ G06F 1/20; G06F 1/206; H05K 7/20745
USPC ............................ 361/679.46, 679.47, 679.52
See application file for complete search history.

(56) References Cited

U.S. PATENT DOCUMENTS

| | | | |
|---|---|---|---|
| 7,486,511 B1 * | 2/2009 | Griffel et al. | 361/679.46 |
| 7,643,291 B2 * | 1/2010 | Mallia et al. | 361/695 |
| 8,885,335 B2 * | 11/2014 | Magarelli | 361/679.47 |
| 2009/0168345 A1 * | 7/2009 | Martini | 361/691 |
| 2011/0083824 A1 * | 4/2011 | Rogers | 165/80.2 |
| 2012/0041600 A1 * | 2/2012 | Michael et al. | 700/276 |
| 2014/0137491 A1 * | 5/2014 | Somani et al. | 52/220.1 |

* cited by examiner

*Primary Examiner* — Anthony Haughton
(74) *Attorney, Agent, or Firm* — Fenwick & West LLP

(57) ABSTRACT

A data center includes a wind collecting structure that directs prevailing winds external to the data center into an interior of the wind collecting structure. The wind collecting structure includes vents around its perimeter configured to selectively open on a side of the wind collecting structure receiving prevailing wind, pressurizing the intake air. The pressurized air flows from the wind collecting structure through a compartment of the data center including computing assets. The air is directed across the computing assets to extract heat from the computing assets during operation.

14 Claims, 2 Drawing Sheets

COOLING SERVERS IN A DATA CENTER USING PREVAILING WINDS

BACKGROUND

This invention relates generally to data centers, and more particularly to efficient cooling of computing devices within a data center.

Heat removal is an important consideration in computer system and data center design. As the number of servers deployed in a data center increases, heat generated by electronic components in the servers during operation also increases. Because the reliability of servers used by the data center decreases if they operate at a high temperature over time, a portion of the data center's power is used for cooling electronics in the servers. However, as the number of servers included in a data center increases, a greater portion of the power consumed by the data center is used to cool electronics within the servers.

Conventionally, servers in a data center are individually equipped with cooling systems to dissipate heat produced during operation. Commonly, each server includes a fan for dissipating heat generated during operation. However, these internal fans generally consume about 10%-15% of the power used by the servers, and also produce heat during operation, limiting their effectiveness. Additionally, a room in the data center housing the servers may also be cooled using methods such as air conditioning, using additional power for cooling.

SUMMARY

Embodiments of the invention reduce or eliminate the need for power drawing sources, such as fans or air conditioning systems, to cool computing assets in a data center. A compartment in a data center houses computing assets, such as servers, and receives air external to the data center from a wind collecting structure that captures prevailing winds from the environment surrounding the data center. The data center is configured to direct the prevailing winds toward an intake. For example, the intake is a circular intake with vents positioned around its circumference. The vents are configured to selectively open on the sides of the intake receiving the prevailing wind, which pressurizes the air received via the intake. For example, in some embodiments, the unidirectional flow of air is effectuated using backdraft dampers on the vents, which open when there is a positive pressure on the exterior of the intake and close when there is negative pressure on the exterior of the intake. Hence, the vents direct winds from the environment surrounding the data center into the data center.

The wind collecting structure may have a sloped or contoured design to increase the wind speed and/or pressure of the wind directed into the data center. Airflow is directed from the wind collecting structure through the compartment housing the computing assets, causing air to flow across the computing assets and direct heat away from the computing assets and into an exhaust system. Hence, the airflow dissipates heat generated during operation of the computing assets. Wind turbines may be placed in the path of the airflow from the wind collecting structure through the compartment to generate power from the airflow. The power may be supplied to the computing assets or to other systems of the data center. In one embodiment, a sensor monitors air temperature, air pressure, and/or air flow and adjusts the intake of air into the compartment or the exhaust of air from the compartment based on the monitored data. For example, if the temperature near one or more computing assets reaches a threshold value or the airflow near one or more computing assets reaches a threshold flow rate, the sensor communicates with a control system, which generates a control signal increasing the rate at which prevailing winds are directed into the data center and through the compartment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Data Center Architecture

Figure 1:
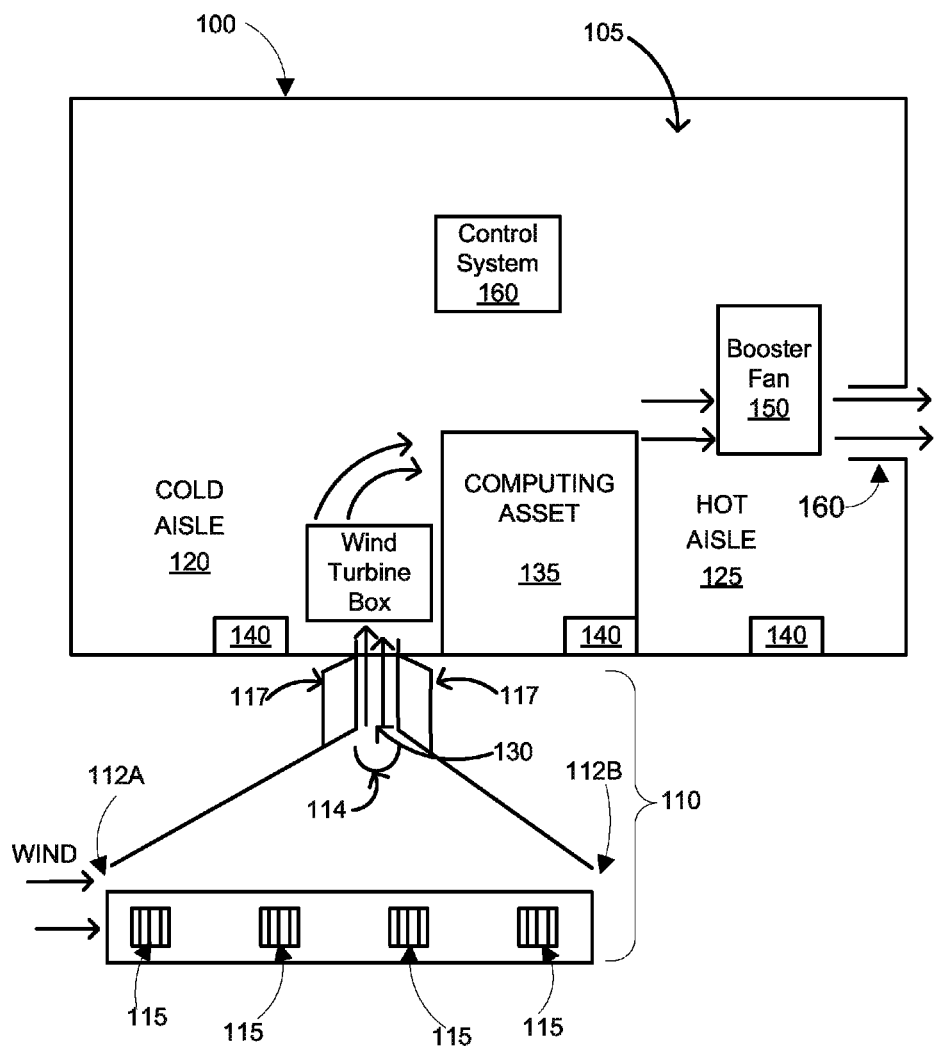
FIG. 1 is a side view of a data center for cooling servers by directing prevailing winds external to the data center through a compartment of the data center including computing assets, in accordance with an embodiment of the invention.

An example data center 100 cooling one or more computing assets 135 is illustrated in FIG. 1. As shown in FIG. 1, the data center 100 includes a compartment 105 housing the computing assets 135, such as servers. A wind collecting structure 110 captures air external to the data center 100 and directs the captured air into the compartment 105. For example, the wind collecting structure 110 directs prevailing winds from the environment external to the data center 100 into the compartment 105. In one embodiment, the exterior of the data center 100 is configured to direct prevailing winds external to the data center toward the wind collecting structure 110, which may be circular. The wind collecting structure 110 is further described below in conjunction with FIG. 2. The wind collecting structure 110 is fluidly connected to the compartment 105, allowing air to flow from the wind collecting structure 110 into the compartment 105 through an opening 130. An exhaust 160 is also fluidly connected to the compartment, allowing air to flow through the compartment 105 and exit the compartment 105 via the exhaust 160. The exhaust 160 may direct air from the compartment 105 to the environment external to the data center 100 or to any other suitable location. Hence, winds external to the data center 100 are directed to the wind collecting structure 110, which directs the air flow through the compartment 105. The air collects heat from the computing assets 135 as it flows through the compartment 105 and the heated air is directed outside of the compartment 105 via the exhaust 160.

As shown in FIG. 1, external air enters the wind collecting structure 110 through a number of intakes or vents 115. The wind collecting structure 110 includes vents 115 along various sides, allowing the wind collecting structure 110 to collect wind from various sides of the data center 100. Hence, even as winds in the environment external to the data center 100 change directions, a portion of the wind may be directed into the wind collecting structure 100.

In some embodiments, the vents 115 have backdraft dampers, which open a vent 115 when there is a positive pressure on an external surface of the vent 115 and close the vent when there is a negative pressure on the external surface of the vent 115. Backdraft dampers allow wind to enter the wind collecting structure 110 by opening a vent 115 when wind is contacting a vent 115, or contacts a side of the wind collecting structure 110 including the vent 115, while preventing the wind from exiting the wind collecting structure through vents 115 on the leeward side of the wind collecting structure 110 by closing the vents 115 on the leeward side. Air flowing into the wind collecting structure 110 is directed toward the compartment. For example, the air pressure within the wind collecting structure 110 increases as air flows into the wind collecting structure 110, and the air is directed toward the lower-pressure compartment 105.

As shown in FIG. 1, the wind collecting structure 110 is configured so that when wind flows across the wind collecting structure 110, a portion of the wind enters the wind collecting structure 110 via an inlet 112A on the windward side of the wind collecting structure 110, which may be a vent 115. Additionally, the shape of the wind collecting structure 110 creates a vortex when the wind flows across it, allowing positive pressure to enter an additional inlet 112B on the leeward side of the wind collecting structure 110, which may be a vent 115 or separate from the vents 115. For example, the wind collecting structure 110 may be a frustum of a cone or pyramid having a base in a plane including the inlets 112A, 112B and another base in a plane parallel to the plane including the inlets 112A, 112B and including the opening 130. In other embodiments, the wind collecting structure 110 has a conical structure, or any other suitable structure. In the example wind collecting structure 110 shown by FIG. 1, the wind collecting structure 110 includes an internal roof 114 positioned near the opening 130 between the wind collecting structure 110 and the compartment 105. While the internal roof 114 may be omitted in various embodiments, inclusion of the internal roof 114 increases airflow from the wind collecting structure 110 to the compartment 105. In some embodiments, one or more strakes 117 are included to direct airflow external to the wind collecting structure 110 toward the opening 130. While FIG. 1 shows the wind collecting structure 110 as a single structure, in other embodiments, the inlets 112A, 112B may be located in different buildings, allowing the wind collecting structure 110 to be formed from multiple buildings or structures.

The compartment 105 may include a cold aisle 120 and a hot aisle 125. As shown in FIG. 1, air flows from the wind collecting structure 110 through an opening 130 and into the compartment 105, which directs the air across the computing assets 135. The wind collecting structure 110 has a higher pressure relative to the compartment 105, so air flows from the wind collecting structure 110 into the compartment 105. The compartment 105 may have a cold aisle 120 which a first side of the computing assets 135 contacts and a hot aisle 125 contacting a second side of the computing assets 135. The cold aisle 120 may have a higher pressure than the hot aisle 125, so air flows from the cold aisle 120, across the computing assets 135, and into the hot aisle 125. For example, air entering the compartment 105 via the opening 130 increases the pressure of the cold aisle 120, causing air to flow from the cold aisle 120 across the computing assets 135 to the lower pressure hot aisle 125. The air flows through the hot aisle 125 to the exhaust 160. The air flow collects heat from the computing assets 135 and travels through the hot aisle 125 to the exhaust 160, which directs the warmed air away from the compartment 105. This airflow directs air from outside the data structure 100 using the wind collecting structure 110 into the compartment 105, where the air travels across the computing assets 135 and collects heat generated by the computing assets 135. In some embodiments, one or more booster fans 150 are included in the compartment 105 to improve air flow from the cold aisle 120 across the computing assets 135 and to the exhaust 160 via the hot aisle 125. For example, the booster fans 150 are included in the exhaust 160. In some embodiments, the cold aisle 120 is partitioned from the hot aisle 125 so that the path of least resistance from the cold aisle 120 to the hot aisle 125 is across computing assets 135.

In some embodiments, air entering the compartment 105 from the wind collecting structure 110 is cooled. For example, the air from the wind collecting structure 110 is directed through a cooling system before entering the compartment 105. For example, free-air cooling, such as air-side or liquid-side economization, is used to cool air entering the compartment 105 from the wind collecting structure 110. Other examples of cooling systems include: an evaporative cooling system, an absorption cooling system, an adsorption cooling system, a vapor-compression cooling system, or another system extracting heat from air. The cooling system may also modify the humidity of the air from the wind collecting structure 110. For example, the cooling system may cool the air and modify its humidity to be within a specified range, and the air from the cooling system is directed to the cold aisle 120. As another example, a cooling system introduces droplets of a liquid, such as water, to evaporatively cool air from the wind collecting structure 110.

As used herein, "cold air" or "cooler air" refers to air having a temperature less than an ambient air temperature, air having a temperature below a specified temperature, or air having a lower relative temperature than air in a different region. For example, air received from the wind collecting structure 110 may be referred to as "cold" or "cooler" air, when compared to the higher temperature of the air in the compartment 105 housing the operating computing assets 135. As another example, air included in the cold aisle 140, referred to as "cold air," has a first temperature, while air included in the hot aisle 145, referred to as "hot air," has a second temperature that is higher than the first temperature.

In some embodiments, the data center 100 includes one or more wind turbines 170 positioned in the flow of air from the wind collecting structure 110 through the opening 130 into the compartment 105. The one or more wind turbines 170 may generate power from the flowing air using any suitable method. The power may be used to operate the computing assets 135 or other components of the data center 100. In one embodiment, wind turbines 170 are located at the base of the data center 100 and provide back pressure to increase the pressure of the cold aisle 120 and provide power to the computing assets 135.

In different embodiments, the flow of air through the compartment 105 of the data center 100 data center may be statically or dynamically controlled. If the air flow is statically controlled, the wind collecting structure 110 may use a louver-based system to regulate air intake from outside the data center 100 for providing cooler air in different directions, at different flow rates, and/or at different temperature levels. Alternatively, collection of air from outside the data center 100 via the wind collecting structure 110 is dynamically modified by using one or more supply fans, which may serve as booster fans to increase airflow.

The data center 100 may also include one or more sensors 140 positioned in locations where air flows through various regions of the compartment 105. For example, sensors 140 are positioned proximate to the opening from the wind collecting structure 110 to the compartment 105, proximate to the computing assets 135, in the cold aisle 120, in the hot aisle 125 and/or proximate to the exhaust 160. The sensors 140 may monitor any relevant air characteristic or characteristics. Examples of characteristics monitored by the sensors 140 include: air flow, air temperature, air humidity, absolute air pressure, differential air pressure, or any other data describing air flow and/or air temperature, and combinations thereof.

The sensors 140 may be placed in locations where air temperature or pressure is likely to be different relative to other locations in the compartment 105. For example, sensors 140 are placed in the cold aisle 120 and the hot aisle 125. Alternatively, sensors 140 are placed near the opening 130 from the wind collecting structure 110 to the compartment 105 and near the exhaust 160. Additionally, one or more sensors 140 may be located in the wind collecting structure 110 or on external surfaces of the wind collecting structure 110 to capture information about air external to the data center 100.

In various embodiments, the sensors 140 communicate with a control system 160, which generates a control signal responsive to data from one or more sensors 140 to modify operation of an air intake or supply system. For example, responsive to detecting a temperature reaching a threshold value, an air flow reaching a threshold flow rate, or a pressure difference between different regions of the compartment or stack system falling below a threshold value, a sensor 140 communicates with the control system 160, which generates a control signal increasing the rate at which air is taken into the data center 100 via the wind collecting structure 110 or modifying cooling of air from the wind collecting structure 110 that is directed to the compartment 105. Hence, the sensors 140 and control system 160 implement a feedback loop allowing the data center 100 to modify how air flows through the compartment 105 responsive to changes in the exterior environment, such as speed of prevailing winds, and/or changes in the data center 100 interior environment to more effectively cool the computing assets 135. For example, responsive to changes in the wind speed, wind direction, or temperature of the air outside of the data center 105, the opening of the vents 115 may be modified and/or a cooling system may be modified to cool air received via the wind collecting structure 110 before it is directed to the compartment 105. In embodiments including wind turbines 170, the control system 160 may also regulate the recovery of power from the wind turbines.

Figure 2:
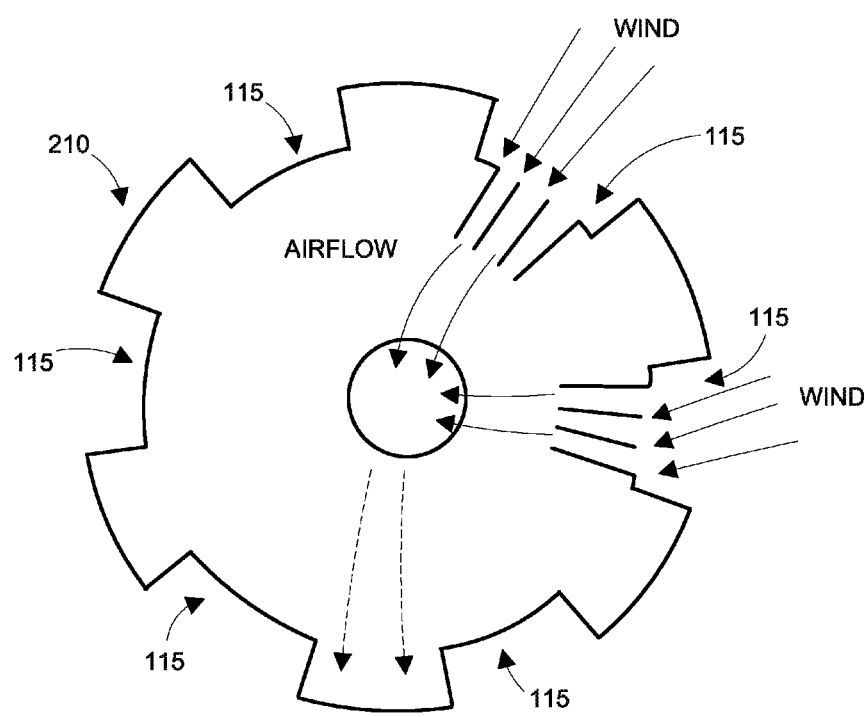
FIG. 2 shows a wind collecting structure for directing prevailing winds external to a data center through the data center in accordance with an embodiment of the invention.

FIG. 2 shows one example of a circular wind collecting structure 210 including multiple vents 115 around its circumference. In other embodiments, the wind collecting structure 210 may have any suitable shape with vents 115 around the perimeter of the structure. As described above, the vents 115 are configured to selectively open so that vents 115 on a windward side of the circular wind collecting structure 210 are open, allowing air to flow into the circular wind collecting structure 210. The wind directing the air into the circular wind collecting structure 210 moves the air into and through the wind collecting structure 210 without using a fan. In one embodiment, the vents 115 include backdraft dampers to provide a unidirectional flow of air through the circular wind collecting structure 210. A backdraft damper opens a vent 115 when there is a positive pressure on the exterior of the vent 115 and closes the vent 115 when there is negative pressure on the exterior of the vent 115. Hence, the vents 115 direct winds from the environment surrounding the data center 100 into the data center 100 by allowing air to flow into the circular wind collecting structure 210, or any other wind collecting structure 110, while preventing air from flowing out of the vents 115 of the wind collecting structure 110. This configuration causes the pressure in the circular wind collecting structure 210 to be higher than a pressure in the compartment 105 when the circular wind collecting structure 210 receives air through one or more of the vents 115, so air flows from the circular wind collecting structure 210 into the lower pressure compartment 105. In some embodiments, the wind collecting structure 110 has a sloped or contoured design to increase the speed and/or pressure of air travelling through the wind collecting structure 110.

While embodiments configured to include a cold aisle and a hot aisle are described above, the techniques described above may be applied to generate an airflow inside other data center configurations to cool computing assets included in a data center. For example, the preceding techniques may be applied to any suitable data center configuration to provide an airflow from a portion of the data center to another portion of the data center. Additionally the techniques described above may be used in other cooling scenarios to provide an airflow across devices to extract heat from the devices.

For example, in one embodiment, a heat conductive element, such as a cold plate or cooling fin, is thermally coupled to one or more heat generating devices in the data center. The heat conductive element is configured to absorb heat generated during operation of the servers and other equipment in the data center, but it is not in fluidic connection with the equipment. In an embodiment, rather than using the ambient air flowing from a cold aisle through the servers to a hot aisle to cool the equipment, the ambient air is directed through the heat conductive element. This cooling airflow extracts heat from the equipment, and the heated air then exits the data center via an exhaust. This cooling airflow is thus open to the atmosphere, whereas any airflow within the equipment is part of a closed loop. This embodiment may provide a lower resistance to the cooling airflow, thereby lowering the requirements of any fans in the path to generate the airflow necessary for proper cooling. This may also reduce or eliminate the need for filters, as the external air does not come into direct contact with the servers, which further lowers the resistance of the airflow path and reduces costs associated with maintaining the filters. In some embodiments, the heat conductive element can be part of the rack in which the servers are mounted or can be part of the servers themselves. In further embodiments, the path of airflow may also include a fan to facilitate the exhaust of heated air from the data center.

Summary

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium, which include any type of tangible media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A data center system comprising:
   a plurality of computing assets included in a compartment, each computing asset having a first side oriented toward a cold aisle and having a second side oriented toward a hot aisle, the hot aisle having a lower pressure relative to the cold aisle so that air flows from the cold aisle to the hot aisle across the computing assets;
   a wind collecting structure exposed to an environment external to the data center system, having a plurality of inlets positioned along a perimeter of the wind collecting structure and facing multiple directions, each inlet configured to receive air from the external environment and direct the air to an interior of the wind collecting structure, the wind collecting structure fluidly coupled to the compartment and configured so that upon receiving air via one or more inlets a pressure in the wind collecting structure is higher than a pressure in the compartment so air flows from the wind collecting structure to the compartment; and
   an exhaust system coupled to the compartment and configured to extract air from the hot aisle.

2. The data center system of claim 1, wherein the wind collecting structure is circular.

3. The data center system of claim 1, wherein the wind collecting structure has a sloped contour to increase a speed of air entering the wind collecting structure.

4. The data center system of claim 3, wherein the sloped contour is configured to increase a pressure of air in the wind collecting structure relative to a pressure of the cold aisle.

5. The data center system of claim 1, wherein the inlets of the wind collecting structure comprise vents having backdraft dampers configured to open a vent if a pressure on an exterior surface of the vent is positive and to close the vent if the pressure on the exterior surface of the vent is negative.

6. The data center system of claim 1, wherein the exhaust system includes one or more fans configured to direct air flow away from the hot aisle.

7. The data center system of claim 1, further comprising one or more turbines included in compartment and positioned along a flow of air from the wind collecting structure to the cold aisle, the one or more turbines configured to generate power from the flow of air.

8. The data center system of claim 1, further comprising one or more sensors coupled to a control system that generates a control signal modifying a flow of air from the wind collecting structure to the cold aisle based on an attribute of air flow through the compartment or through the wind collecting structure.

9. The data center of claim 8, wherein the attribute of airflow through the locations is at least one of an airflow rate, a temperature, and a pressure difference between various locations in the system.

10. The data center system of claim 8, wherein the control signal causes a cooling system to decrease a temperature of air flowing into the cold aisle from the wind collecting structure responsive to the temperature reaching a threshold temperature.

11. The data center system of claim 1, wherein airflow through the wind collecting structure reduces the need for power drawing sources to cool computing assets in the data center.

12. The data center system of claim 1, wherein an exterior of the data center system is configured to direct winds from external environments surrounding the data center toward the wind collecting structure.

13. The data center system of claim 1, wherein the wind collecting structure captures winds from the environment external to and surrounding the data center and directs the captured wind into the compartment.

14. A data center system comprising:
   a plurality of computing assets included in a compartment, each computing asset having a first side oriented toward a cold aisle and having a second side oriented toward a hot aisle, the hot aisle having a lower pressure relative to the cold aisle so that air flows from the cold aisle to the hot aisle across the computing assets;
   a wind collecting structure exposed to an environment external to the data center system having a plurality of inlets configured to receive air from the external environment, positioned along a perimeter of the wind collecting structure and facing multiple directions, an inlet configured to open when an air flow contacts an exterior surface of the inlet and direct the air flow to an interior of the wind collecting structure, the wind collecting structure fluidly coupled to the compartment and configured so that upon receiving air via one or more inlets a pressure in the wind collecting structure is higher than a pressure in the compartment so air flows from the wind collecting structure to the compartment;
   an exhaust system coupled to the compartment and configured to extract air from the hot aisle.

* * * * *